United States Patent
Kubota et al.

(10) Patent No.: US 10,081,763 B2
(45) Date of Patent: Sep. 25, 2018

(54) OXYNITRIDE FLUORESCENT MATERIAL, METHOD FOR PREPARING SAME, AND LIGHT EMITTING DEVICE PACKAGE USING SAME

(71) Applicant: LG ELECTRONICS INC., Seoul (KR)

(72) Inventors: Shunichi Kubota, Seoul (KR); Satoshi Tanaka, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/120,444

(22) PCT Filed: Jan. 30, 2015

(86) PCT No.: PCT/KR2015/001022
§ 371 (c)(1),
(2) Date: Aug. 19, 2016

(87) PCT Pub. No.: WO2015/130018
PCT Pub. Date: Sep. 3, 2015

(65) Prior Publication Data
US 2017/0218266 A1    Aug. 3, 2017

(30) Foreign Application Priority Data
Feb. 27, 2014 (KR) .................. 10-2014-0023326

(51) Int. Cl.
*H01L 33/50* (2010.01)
*C09K 11/77* (2006.01)
*C09K 11/08* (2006.01)

(52) U.S. Cl.
CPC ...... *C09K 11/7734* (2013.01); *C09K 11/0883* (2013.01); *H01L 33/502* (2013.01);
(Continued)

(58) Field of Classification Search
CPC .......... H01L 33/502; H01L 2933/0041; C09K 11/7734; C09K 11/0663
See application file for complete search history.

(56) References Cited

U.S. PATENT DOCUMENTS

2005/0156496 A1*  7/2005  Takashima ......... C09K 11/0883
313/237

FOREIGN PATENT DOCUMENTS

JP    2004277547    *  7/2004  ... H01L 2224/45139
JP    2009-132916    6/2009
(Continued)

OTHER PUBLICATIONS

International Search Report and Written Opinion dated Apr. 29, 2015 issued in Application No. PCT/KR2015/001022 (with English translation).

*Primary Examiner* — Galina Yushina
(74) *Attorney, Agent, or Firm* — KED & Associates, LLP

(57) ABSTRACT

The present invention relates to a fluorescent material and, more particularly, to an oxynitride fluorescent material, a method for preparing the same, and a light emitting device package using the same. The present invention can provide an oxynitride fluorescent material represented by chemical formula $MA_2N_2O_2$:R, wherein the ratio of M to A is 0.950-0.985:2 (M+R:2A=0.950-0.985:2). M is at least one element selected from Mg, Ca, Sr, and Ba, R, as an activator, is one of the rare-earth elements, and A is at least one element selected from Si and Ge.

8 Claims, 7 Drawing Sheets

(52) U.S. Cl.
CPC .......... *H01L 2224/48091* (2013.01); *H01L 2224/48247* (2013.01); *H01L 2224/48257* (2013.01); *H01L 2224/48465* (2013.01); *H01L 2224/49107* (2013.01); *H01L 2224/73265* (2013.01); *H01L 2224/8592* (2013.01); *H01L 2924/181* (2013.01); *H01L 2933/0041* (2013.01)

(56) References Cited

FOREIGN PATENT DOCUMENTS

| JP | 4442101 | 3/2010 |
| JP | 5151002 | 2/2013 |
| KR | 10-2010-0128336 | 12/2010 |
| KR | 10-2013-0125197 | 11/2013 |

\* cited by examiner

OXYNITRIDE FLUORESCENT MATERIAL, METHOD FOR PREPARING SAME, AND LIGHT EMITTING DEVICE PACKAGE USING SAME

CROSS-REFERENCE TO RELATED PATENT APPLICATIONS

This application is a U.S. National Stage Application under 35 U.S.C. § 371 of PCT Application No. PCT/KR2015/001022, filed Jan. 30, 2015, which claims priority to Korean Patent Application No. 10-2014-0023326, filed Feb. 27, 2014, whose entire disclosures are hereby incorporated by reference.

TECHNICAL FIELD

The present invention relates to a phosphor, in particular, to an oxy-nitride phosphor, a method for manufacturing the same and a light emitting device package using the same.

BACKGROUND ART

Light emitting diodes (LEDs) emitting white light are next-generation light emitting device candidates which can replace fluorescent lights as the most representative conventional lights.

Light emitting diodes have low power consumption as compared to conventional light sources and are environmentally friendly because they do not contain mercury, unlike fluorescent lights. In addition, light emitting diodes have advantages of long lifespan and high response speed as compared to conventional light sources.

Such an LED may be used in combination with a phosphor which absorbs light emitted from the LED and emits various colors of light. The phosphor generally emits white, green and red light.

Currently, white LEDs are produced using a combination of blue LEDs and phosphors for changing emission wavelengths. As the field of white LEDs used extends, there is a need for more efficient LEDs. For this purpose, there is a need for improved luminous efficacy of phosphors. In addition, there is an increasing demand for LEDs with improved reliability.

Phosphors used for LEDs are yellow phosphors and YAG phosphors are known as oxide phosphors. However, such YAG phosphors have problems of low thermal stability, deterioration in brightness when heated, variation in color coordinates and the like.

In addition, oxide phosphors and silicate phosphors are known as yellow to green phosphors, but they have low thermal stability and poor resistance to humidity, thus negatively affecting reliability of LED packages.

Meanwhile, Prior art Patent Document 1 (Japanese Patent Laid-open No. 3851331) discloses an oxynitride phosphor activated by a rare-earth element, wherein the oxynitride phosphor is represented by $MSi_2N_2O_2$ (in which M includes one or more alkali earth metal elements).

In addition, Prior art Patent Document 2 (Japanese Patent Laid-open No. 4442101) discloses an oxynitride phosphor represented by $SrSi_2N_2O_2$:Eu. This discloses that green to yellow light emission phosphors which are excited by a ultraviolet to visible range of excitation light sources.

However, these oxynitride phosphors have excellent thermal stability and eco-friendliness, as compared to oxide phosphors, but lack brightness and require improvement in luminous efficacy.

DISCLOSURE

Technical Problem

An object of the present invention devised to solve the problem lies in an oxy-nitride phosphor with superior brightness, a method for manufacturing the same and a light emitting device package including the same.

Technical Solution

The object of the present invention can be achieved by providing an oxy-nitride phosphor represented by the following Formula 1, wherein M and A are present in a ratio of 0.950:2 to 0.985:2 (M+R:2A):

$$MA_2N_2O_2:R \qquad \text{<Formula 1>}$$

wherein M includes at least one element selected from Mg, Ca, Sr and Ba, R is a rare-earth element as an activator, and A includes at least one element selected from Si and Ge.

In Formula 1, M may be Ca and Sr.
In Formula 1, A may be Si.
The phosphor may have a peak emission wavelength of 530 nm to 580 nm.

In another aspect of the present invention, provided herein is a method of producing an oxy-nitride phosphor comprising forming, using starting materials, an oxy-nitride phosphor represented by the following Formula 1, wherein M and A are present in a ratio of 0.950:2 to 0.985:2 (M+R:2A):

$$MA_2N_2O_2:R \qquad \text{<Formula 1>}$$

wherein M includes at least one element selected from Mg, Ca, Sr and Ba, R is a rare-earth element as an activator, and A includes at least one element selected from Si and Ge.

The starting materials may include at least one of carbonate of an alkali earth metal, silicon oxide, silicon nitride, europium oxide, Ca, Sr, Si and Eu, oxides thereof, and nitrides thereof.

The starting materials may include at least one of $SrCO_3$, $CaCO_3$, $Eu_2O_3$, $Si_3N_4$ and $SiO_2$.

In Formula 1, M may be Ca and Sr.

The formation of the phosphor may be carried out by baking at a temperature of 1,500 to 1,600° C. under a reducing atmosphere or an inert atmosphere.

The phosphor may have a peak emission wavelength of 530 nm to 580 nm.

In Formula 1, A may be Si.

In another aspect of the present invention, provided herein is a light emitting device package including a first phosphor represented by Formula 1, or represented by Formula 1 and produced by the method described above, and a light emitting device for emitting excitation light to excite the first phosphor.

The light emitting device package may further include a second phosphor having a peak wavelength of the excitation light and an emission peak different from a peak wavelength of the first phosphor.

The light emitting device package may have an emission spectrum having one or more emission peaks in at least one of wavelength bands of 430 to 500 nm and 500 to 730 nm, by the light emitting device or the first phosphor.

A light transmitting resin may be disposed on the light emitting device and the first phosphor may be present in the light transmitting resin.

Advantageous Effects

The present invention has an effect of providing an oxy-nitride phosphor with high brightness and luminous efficacy.

The technical effects of the present invention are not limited to those described above and other effects not described herein will be clearly understood by those skilled in the art from the following description.

BEST MODE

Figure 1:
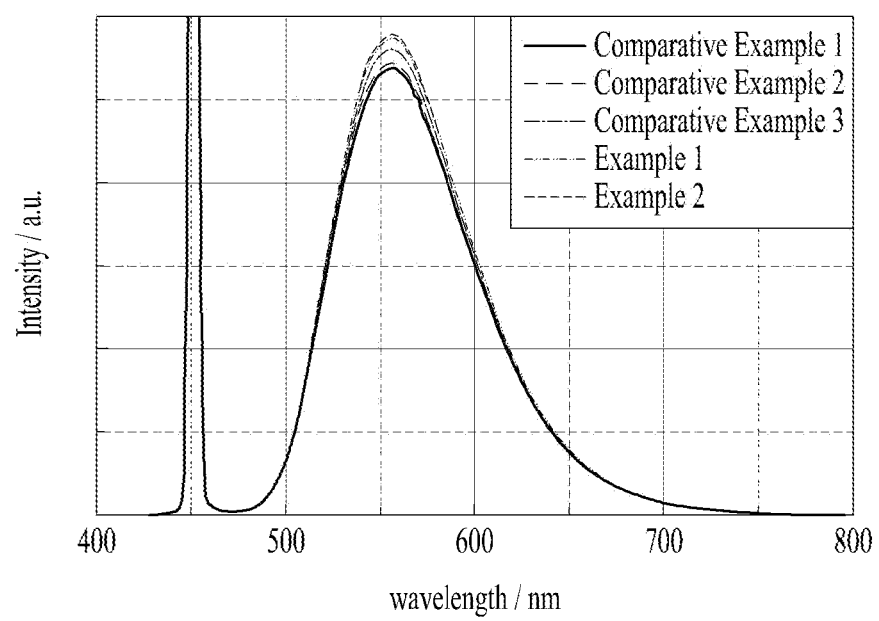
FIGS. 1 and 2 show an emission spectrum of respective Examples and Comparative Examples according to the present invention.

Reference will now be made in detail to the preferred embodiments of the present invention, examples of which are illustrated in the accompanying drawings.

However, the present invention allows various modifications and variations and specific embodiments thereof are exemplified with reference to the drawings and will be described in detail. The present invention should not be construed as limited to the embodiments set forth herein and includes modifications, equivalents and substitutions compliant with the spirit or scope of the present invention defined by the appended claims.

It will be understood that when an element such as a layer, area or substrate is referred to as being "on" another element, it may be directly on the element, or one or more intervening elements may also be present therebetween.

In addition, it will be understood that although terms such as "first" and "second" may be used herein to describe elements, components, areas, layers and/or regions, the elements, components, areas, layers and/or regions should not be limited by these terms.

In the present invention, based on the composition of M (alkali earth metal) and silicon (Si) (or germanium (Ge)) in formula representing an oxy-nitride phosphor, phosphors with various M/Si compositions are synthesized and light emission characteristics thereof are compared and reviewed, as shown in the following example.

As a result, oxynitride phosphors produced under predetermined composition conditions defined in the present invention are provided and such phosphors have superior brightness.

As such, the brightness of phosphors can be improved by controlling a molar ratio of an alkali earth metal (M) and Si (or Ge) within a predetermined range.

The present invention provides an oxynitride phosphor represented by Formula 1 below.

$$MA_2N_2O_2:R \quad \text{[Formula 1]}$$

wherein M includes at least one element selected from Mg, Ca, Sr and Ba, R is a rare-earth element as an activator, and A includes at least one element selected from Si and Ge.

The present invention provides an oxynitride phosphor represented by Formula 1, wherein M and A are present in a ratio of 0.950:2 to 0.985:2 (M+R:2A).

More specifically, in Formula 1, M is Ca and Sr.

In addition, for example, in Formula 1, A is Si.

The phosphor represented by Formula 1 may have a peak emission wavelength of 530 nm to 580 nm.

Hereinafter, a method of synthesizing an oxynitride phosphor according to an embodiment of the present invention will be described. However, the present invention is not limited to such a method.

As starting materials or raw materials, $SrCO_3$ (purity 4N), $CaCO_3$ (purity 4N), $Eu_2O_3$ (purity 4N), $Si_3N_4$ (purity 3N) and $SiO_2$ (purity 2N) are prepared. In this case, the materials having the corresponding purities are used, but the present invention is not limited thereto.

The contents of respective materials are determined according to the composition set forth in the following Table 1 and are then mixed. The mixed raw materials may be baked using a boron nitride crucible, a boat or a setter.

When an alumina crucible commonly used for baking is used, it may be difficult to obtain the desired phosphors by reaction with the raw materials. Accordingly, it is preferable to bake phosphor raw materials using a crucible made of boron nitride prebaked pellets.

The baking atmosphere is preferably a reducing atmosphere using hydrogen, ammonia or the like. In an embodiment of the present invention, the baking is carried out under a nitrogen gas ($N_2$) atmosphere containing 4% hydrogen gas ($H_2$) by feeding the mix gas ($H_2$—$N_2$) at a flow rate of 500 ml/min.

As described above, the baking furnace is a baking furnace capable of realizing a reducing atmosphere and is a tubular, high-frequency or metal furnace.

The baking temperature is preferably 1,400 to 1,700° C., more preferably 1,500 to 1,600° C.

The baking time is one hour or longer, more preferably 6 hours or longer. Baking for a long time can make the composition homogenous, but cause an increase in manufacturing costs.

In an embodiment of the present invention, the phosphor is produced by baking at 1,525° C. for 6 hours using an atmosphere tubular furnace vertical to the baking furnace.

The phosphor baked by the aforementioned process is obtained as a lump after baking and may be produced into a powder from taking out from the baking furnace.

The baked phosphor may contain different forms of particles incorporated during synthesis. Accordingly, post-treatment may be conducted in order to remove the particles. The different forms of particles can be removed by cleaning using an ordinary acid or alkaline solution. The cleaning is preferably carried out using hydrochloric acid or nitric acid. For example, cleaning is carried out while applying ultrasound to the particles in a beaker using 1N nitric acid for 15 minutes.

Then, the different forms of particles are precipitated, separated and then washed with pure water to remove the acid. After washing, the particles may be heated in the air at 80° C. in an oven, dried and then collected.

Hereinafter, a variety of Examples will be described, in particular, based on comparison with Comparative Examples.

<Example 1> (Ca:Sr=0.72)

$SrCO_3$, $SiO_2$, $Si_3N_4$, $Eu_2O_3$ and $CaCO_3$ as raw materials were mixed in weights of 9.415 g, 3.040 g, 9.806 g, 3.142 g and 4.596 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Example 2> (Ca/Sr=0.72)

$SrCO_3$, $SiO_2$, $Si_3N_4$, $Eu_2O_3$ and $CaCO_3$ as raw materials were mixed in weights of 9.500 g, 2.953 g, 9.738 g, 3.171 g and 4.637 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Example 3> (Ca:Sr=1.85)

$SrCO_3$, $SiO_2$, $Si_3N_4$, $Eu_2O_3$ and $CaCO_3$ as raw materials were mixed in weights of 4.894 g, 3.270 g, 10.373 g, 3.500 g and 7.968 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Example 4> (Ca:Sr=1.85)

$SrCO_3$, $SiO_2$, $Si_3N_4$, $Eu_2O_3$ and $CaCO_3$ as raw materials were mixed in weights of 4.942 g, 3.178 g, 10.305 g, 3.568 g and 8.041 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Comparative Example 1> (Ca:Sr=0.72)

$SrCO_3$, $SiO_2$, $Si_3N_4$, $Eu_2O_3$ and $CaCO_3$ as raw materials were mixed in weights of 9.148 g, 3.312 g, 10.021 g, 3.053 g and 4.466 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Comparative Example 2> (Ca:Sr=0.72)

$SrCO_3$, $SiO_2$, $Si_3N_4$, $Eu_2O_3$ and $CaCO_3$ as raw materials were mixed in weights of 9.239 g, 3.219 g, 9.948 g, 3.084 g and 4.510 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Comparative Example 3> (Ca:Sr=0.72)

$SrCO_3$, $SiO_2$, $Si_3N_4$, $Eu_2O_3$ and $CaCO_3$ as raw materials were mixed in weights of 9.328 g, 3.129 g, 9.876 g, 3.113 g and 4.553 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Comparative Example 4> (Ca:Sr=1.85)

$SrCO_3$, $SiO_2$, $Si_3N_4$, $Eu_2O_3$ and $CaCO_3$ as raw materials were mixed in weights of 4.795 g, 3.460 g, 10.514 g, 3.249 g and 7.802 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Comparative Example 5> (Ca:Sr=1.85)

$SrCO_3$, $SiO_2$, $Si_3N_4$, $Eu_2O_3$ and $CaCO_3$ as raw materials were mixed in weights of 4.845 g, 3.364 g, 10.443 g, 3.465 g and 7.883 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

<Comparative Example 6> (Ca:Sr=1.85)

$SrCO_3$, $SiO_2$, $Si_3N_4$, $Eu_2O_3$ and $CaCO_3$ as raw materials were mixed in weights of 4.989 g, 3.089 g, 10.237 g, 3.568 g and 8.117 g, respectively, and the obtained mixture was fed into a boron nitride crucible and baked under a reducing atmosphere using a hydrogen-nitrogen ($H_2$—$N_2$) mix gas at 1,500° C. for about 6 hours. Then, the raw materials were washed with 1 L of 1M nitric acid and then dried.

TABLE 1

|   |   | Content (unit: g) | | | | | Values obtained by ICP (inductively coupled plasma) analysis (unit: at %) | | | | (Ca + Sr + Eu)/Si*2 | Normalized emission intensity |
|---|---|---|---|---|---|---|---|---|---|---|---|---|
|   |   | $SiO_2$ | $Si_3N_4$ | $CaCO_3$ | $SrCO_3$ | $Eu_2O$ | Ca | Sr | Eu | Si | | |
| Ca/Sr = 0.72 | Example 1 | 3.040 | 9.806 | 4.596 | 9.415 | 3.142 | 4.91 | 6.64 | 1.90 | 27.81 | 0.967 | 100 |
|  | Example 2 | 2.953 | 9.738 | 4.637 | 9.500 | 3.171 | 4.96 | 6.67 | 1.91 | 27.52 | 0.984 | 99.4 |
|  | Comparative Example 1 | 3.312 | 10.021 | 4.466 | 9.148 | 3.053 | 4.57 | 6.27 | 1.81 | 28.85 | 0.877 | 94.1 |
|  | Comparative Example 2 | 3.219 | 9.948 | 4.510 | 9.239 | 3.084 | 4.63 | 6.32 | 1.81 | 28.83 | 0.885 | 95.2 |
|  | Comparative Example 3 | 3.129 | 9.876 | 4.553 | 9.328 | 3.113 | 4.78 | 6.50 | 1.86 | 28.01 | 0.938 | 97.6 |
| Ca/Sr = 1.85 | Example 3 | 3.270 | 10.373 | 7.963 | 4.894 | 3.500 | 8.24 | 3.35 | 2.02 | 28.62 | 0.952 | 100 |
|  | Example 4 | 3.178 | 10.305 | 8.041 | 4.942 | 3.534 | 8.32 | 3.39 | 2.04 | 28.28 | 0.972 | 99.7 |
|  | Comparative Example 4 | 3.460 | 10.514 | 7.802 | 4.795 | 3.429 | 7.72 | 3.09 | 1.88 | 29.41 | 0.864 | 93.7 |
|  | Comparative Example 5 | 3.364 | 10.443 | 7.883 | 4.845 | 3.465 | 8.03 | 3.20 | 1.95 | 28.68 | 0.919 | 97.4 |
|  | Comparative Example 6 | 3.089 | 10.237 | 8.117 | 4.989 | 3.568 | 8.49 | 3.43 | 2.07 | 28.23 | 0.991 | 97.9 |

Figure 2:
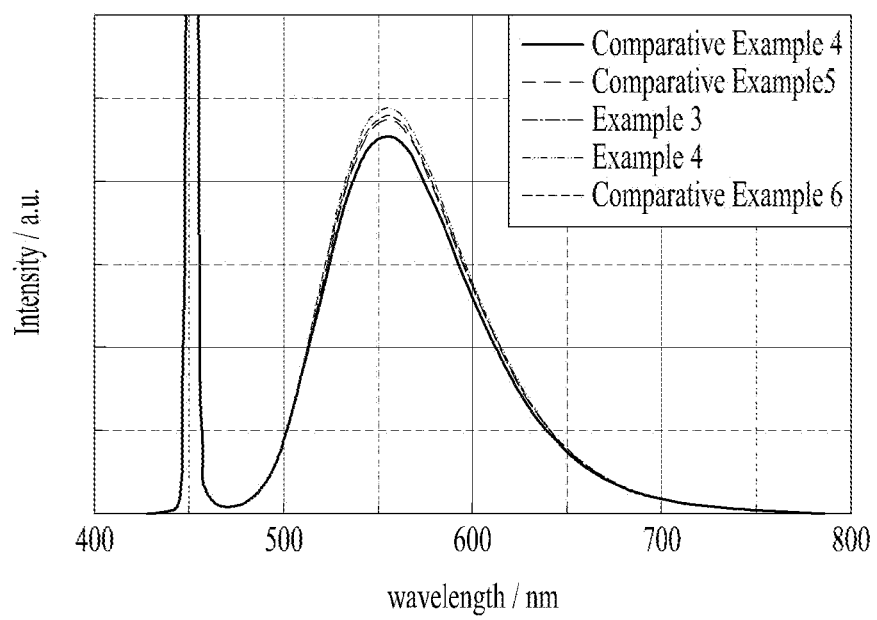

Emission characteristics of the samples obtained in respective Examples and Comparative Examples were measured using an emission spectrometer. FIGS. 1 and 2 show an emission spectrum of Examples and Comparative Examples. The emission spectrum shows emission of yellow light having a peak at about 555 nm based on excitation of light with a wavelength of 450 nm.

The contents of Ca, Sr, Eu and Si of the samples synthesized by the method described above were measured using an ICP (inductively coupled plasma) emission spectrometer. These analysis values in atomic percent (at %) are shown in Table 1 above.

In addition, a ratio of an alkaline earth metal and a rare-earth element ((Ca+Sr+Eu)/Si×2) in a case in which an amount of Si is double that of the analysis result is shown in Table 1.

Results of normalization of maximum luminous intensity of samples having a Ca/Sr ratio are shown in Table 1.

Figure 3:
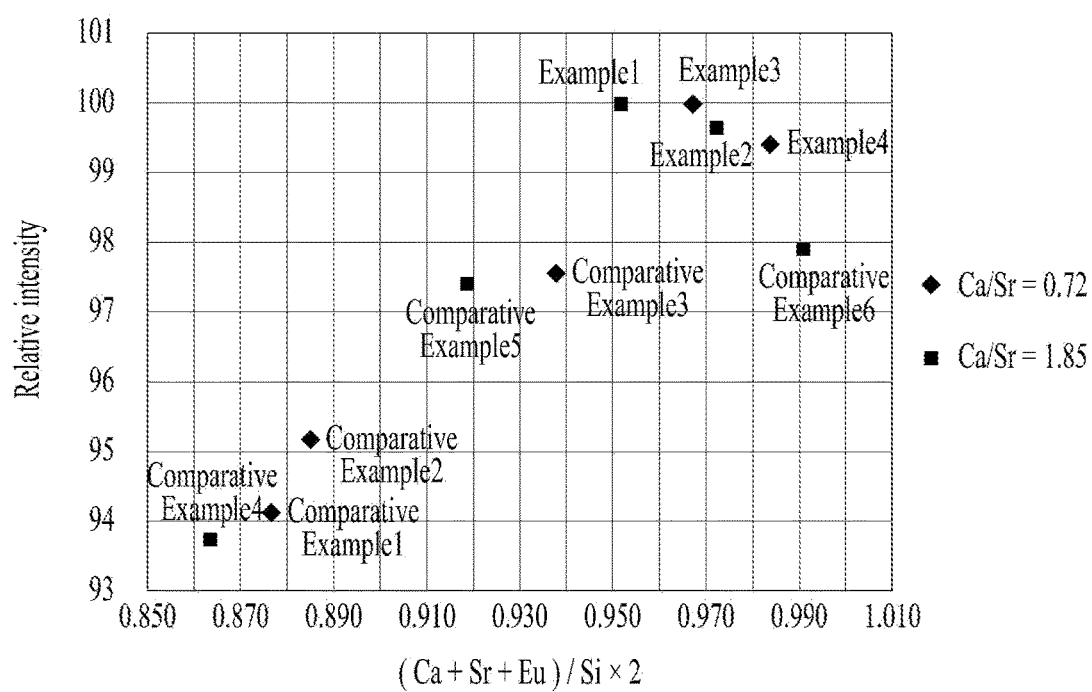
FIG. 3 is a graph showing relation between an amount of an alkaline earth metal M and a luminous intensity of a sample.

The relation between the amount of alkaline earth metal M and the luminous intensity of the sample in Table 1 is shown in FIG. 3. As can be seen, the amount of M is stoichiometric. As shown, when the Ca/Si ratio (Ca/Si×2) is 1.00 or less which is not within the range from not less than 0.950 and not higher than 0.985, good properties can be obtained.

Figure 4:
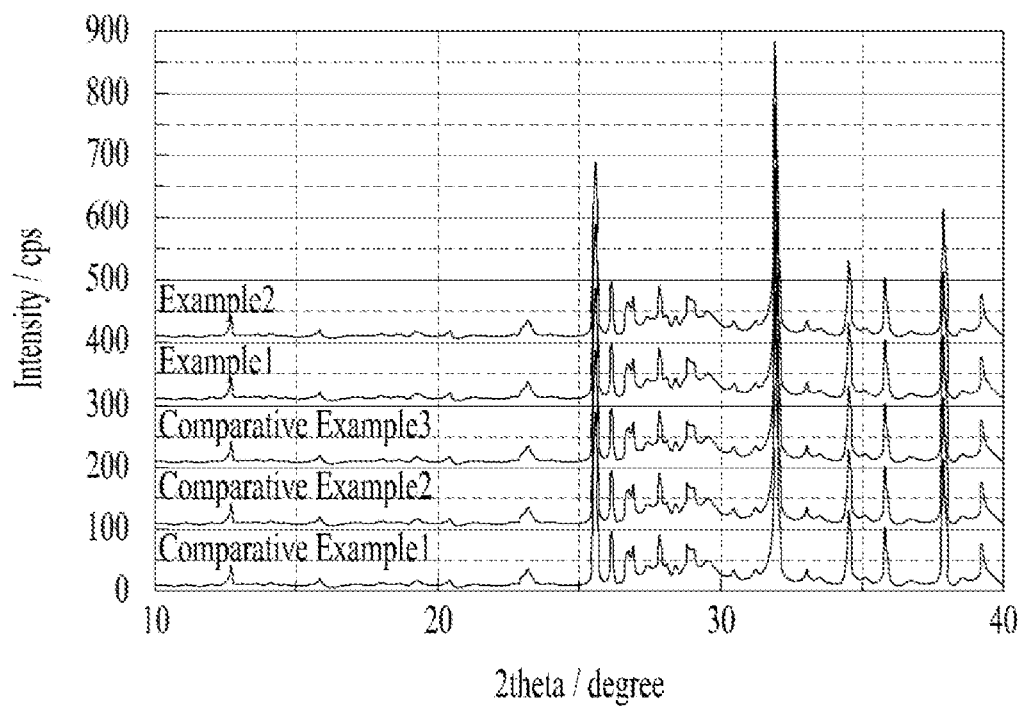
FIGS. 4 and 5 show an XRD (X-ray Diffraction) emission spectrum of Examples 1 to 4 and Comparative Examples 1 to 6 according to the present invention.
Figure 5:
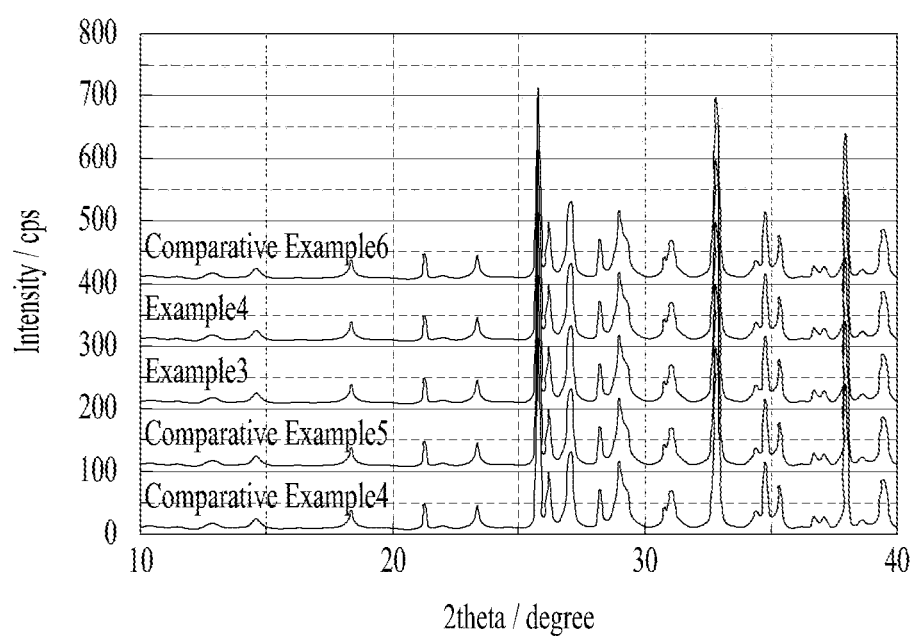

FIGS. 4 and 5 show XRD (X-ray Diffraction) spectrum patterns of Examples 1 to 4 and Comparative Examples 1 to 6. Referring to the drawings, different patterns are obtained as the Ca/Sr ratio varies, whereas there is no great difference in patterns between Examples and/or Comparative Examples having the same Ca/Sr ratio.

Description will be given focusing on composition, based on this fact. In prior art Patent Document 2, the element X of Document 2 corresponding to M of the present invention is limited to 0.5<X<1.5 and the element Y of Document 2 corresponding to Si of the present invention is limited to 1.5<Y<2.5. Accordingly, in Prior art Patent Document 2, X and Y independently have meanings within this range.

Accordingly, X and Y independently having meanings according to prior art Patent Document 2 are entirely different from the ratio of M to Si (M/Si×2) which is a major feature of the present invention.

In addition, in Prior art Patent Document 2, a ratio of M to Si (M:Si) is 1:2. This case corresponds to Comparative Example 6 and Examples of the present invention have very excellent luminous characteristics than that of Comparative Example 6, as shown in FIG. 3.

As such, the present invention has very superior characteristics, as compared to prior art Patent Document 2. This means that the ratio of M to A (M:2A=0.950~0.985:2) defined by the present invention is not simple number limitation and results in significant effects.

<Light Emitting Device>

Figure 6:
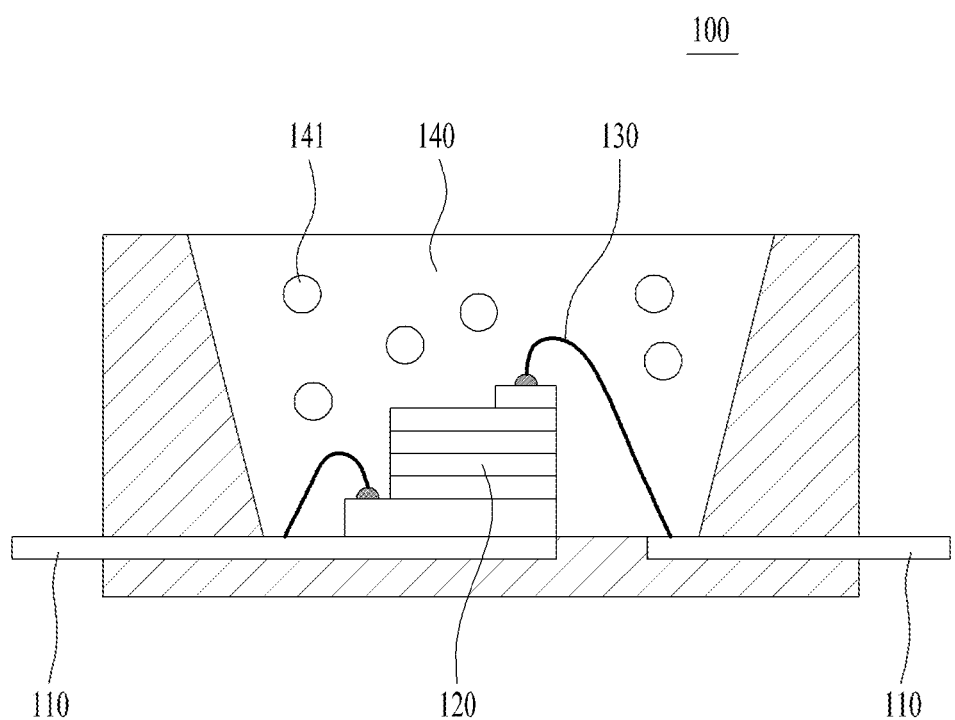
FIG. 6 is a sectional view illustrating a light emitting device package including the oxy-nitride phosphor according to an embodiment of the present invention.

FIG. 6 is a sectional view illustrating a light emitting device package including the oxy-nitride phosphor according to an embodiment of the present invention. FIG. 6 shows a surface-mounted light emitting device package.

As shown in FIG. 6, the surface-mounted light emitting device package 100 according to an embodiment of the present invention includes lead frames 110 of an anode and a cathode and a light emitting device 120 which is disposed on one of the lead frames 110 of the anode and the cathode, and emits light when a voltage is applied thereto. The light emitting device 120 may be a light emitting diode or a laser diode.

The light emitting device 120 is electrically connected to the lead frame 110 by a wire 130 and a light-transmitting resin 140 is molded on the light emitting device 120.

In addition, the light emitting device 120 includes a phosphor 141 dispersed in the light-transmitting resin 140.

The phosphor 141 used herein may include the aforementioned oxy-nitride phosphor as well as other phosphors dispersed therewith. For example, the phosphor 141 may be dispersed together with other phosphors such as YAG and β-SiAlON. In this case, the dispersed other phosphor may be used as a combination of two or more types.

The light emitting device 120 may be a near-ultraviolet or blue light emitting device which emits light having a main peak of emission spectrum in the wavelength range of 400 to 480 nm when a voltage is applied thereto.

In addition, a laser diode, surface-emitting laser diode, inorganic light emitting device, organic light emitting device or the like may be used, as a light emitting device, which has a main emission peak in the same wavelength range, instead of the near-ultraviolet light emitting device. In a preferred embodiment of the present invention, a nitride semiconductor light emitting diode is used.

A light-transmitting resin 140 used as a molding member may be a light-transmitting resin such as an epoxy resin, a silicone resin, a polyamide resin, a urea resin or an acrylic resin. Preferably, the light-transmitting resin 140 is a light-transmitting epoxy or silicone resin.

The light-transmitting resin 140 may be molded around the entirety of the light emitting device 120 and may be molded around a part of the light emitting device 120, if necessary. That is, a low capacity light emitting device is preferably entirely molded, whereas a high power light emitting device is preferably partially molded, because it may be difficult to uniformly disperse the phosphor 141 in the light-transmitting resin 140 due to large size of the light emitting device 120, if the high power light emitting device is entirely molded.

Figure 7:
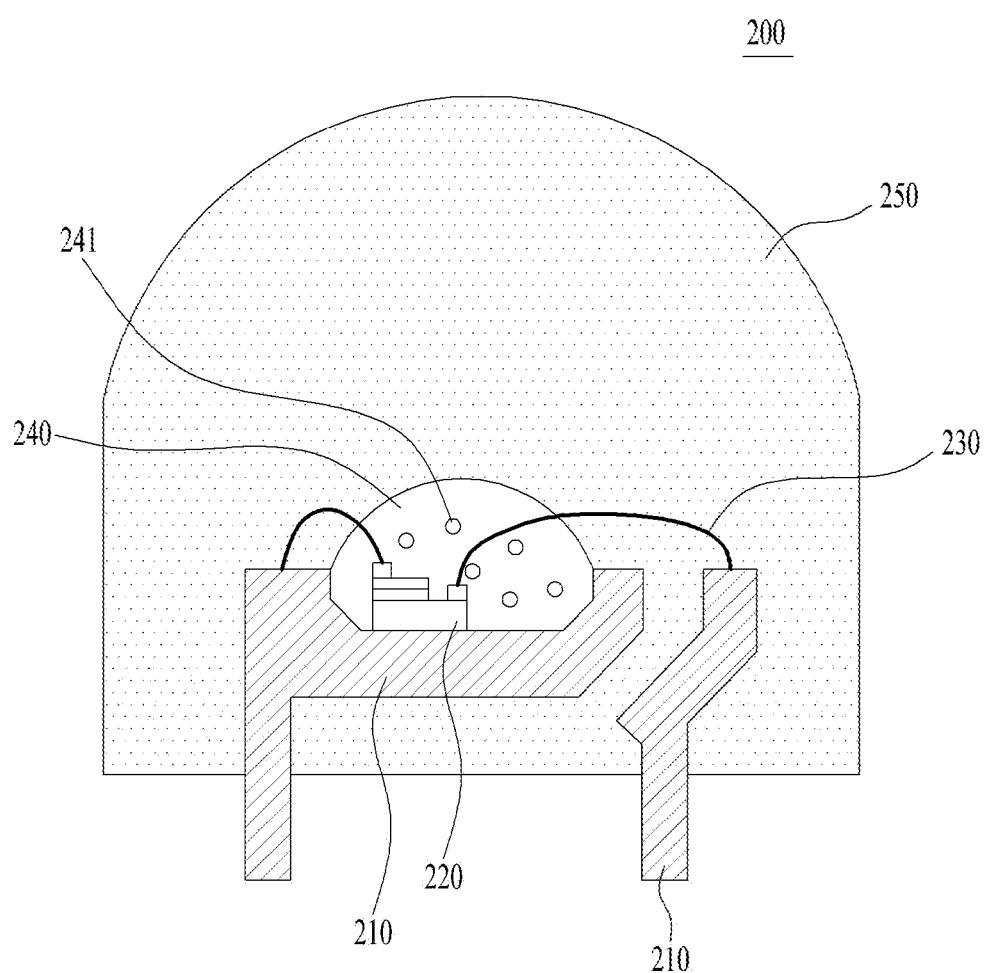
FIG. 7 is a sectional view illustrating a light emitting device package including the oxy-nitride phosphor according to another embodiment of the present invention.

FIG. 7 is a sectional view illustrating a light emitting device package including the oxy-nitride phosphor according to another embodiment of the present invention. FIG. 7 shows a lamp-type light emitting device package.

The lamp-type white light emitting device package 200 includes a pair of lead frames 210 and a light emitting device 220 which emits light when a voltage is applied thereto.

The light emitting device 220 is electrically connected to the lead frame 210 by a wire 230 and a light-transmitting resin 240 is molded on the light emitting device 220.

The phosphor 241 may be dispersed in the light-transmitting resin 240 and an exterior material 250 for finishing the entire outer area of the device may be provided on the light-transmitting resin 240.

The phosphor 241 used herein may include the aforementioned oxy-nitride phosphor as well as other phosphors dispersed therewith. For example, the phosphor 241 may be dispersed together with other phosphors such as YAG and β-SiAlON. In this case, the dispersed other phosphor may be used as a combination of two or more types.

The light-transmitting resin 240 may be molded around the entirety of the light emitting device 220 and may be molded around a part of the light emitting device 120, if necessary. The reason for this has been described above.

The surface-mounted light emitting device package 100 or lamp-type light emitting device package 200 according to the present invention described in detail above may be realized by a white light emitting device package. A process of realizing white light will be described below.

Blue light having a wavelength range of 400 to 480 nm corresponding to near-ultraviolet light, which is emitted from the light emitting devices 120 and 220, passes through the phosphors 141 and 241. At this time, some light drives the phosphors 141 and 241 to generate light having a main peak having an emission wavelength center of 500 to 600 nm, whereas the remaining light passes therethrough while maintaining blue color.

As a result, white light having a spectrum of a wide wavelength of 400 to 700 nm is emitted.

The phosphors 141 and 241 may include the aforementioned oxy-nitride phosphor as well as other phosphors dispersed therewith.

For example, these phosphors 141 and 241 may be used as a mixture of the aforementioned oxy-nitride phosphor (hereinafter, referred to as a "first phosphor") and a second phosphor having an emission peak different from the first phosphor.

The light emitting device packages 100 and 200 may have an emission spectrum having one or more emission peaks in at least one of wavelength bands of 430 to 500 nm and 500 to 730 nm.

Meanwhile, although embodiments according to the present invention disclosed in the specification and the drawings have been provided as specific examples for illustrative purposes, they should not be construed as limiting the scope of the present invention. It will be apparent to those skilled in the art that various modifications and variations can be made in the present invention without departing from the spirit or scope of the invention.

INDUSTRIAL APPLICABILITY

According to the present invention, it is possible to obtain an oxy-nitride phosphor which is a phosphor having high brightness and luminous efficacy, and to realize a light emitting device package with high luminous efficacy including the same.

The invention claimed is:

1. An oxy-nitride phosphor represented by the following Formula 1, wherein M+R and A are present in a ratio of 0.950:2 to 0.985:2 (M+R:2A):

$$MA_2N_2O_2:R \qquad \text{<Formula 1>}$$

wherein M includes at least one element selected from Mg, Ca, Sr and Ba, R is Eu, and A is Si.

2. The oxy-nitride phosphor according to claim 1, wherein, in Formula 1, M is Ca and Sr.

3. The oxy-nitride phosphor according to claim 1, wherein the phosphor has a peak emission wavelength of 530 nm to 580 nm.

4. A light emitting device package comprising:
a first phosphor represented by Formula 1 according to claim 1; and
a light emitting device for emitting excitation light to excite the first phosphor.

5. The light emitting device package according to claim 4, further comprising a second phosphor having a peak wavelength of the excitation light and an emission peak different from a peak wavelength of the first phosphor.

6. The light emitting device package according to claim 4, wherein the light emitting device package has an emission spectrum having one or more emission peaks in at least one of wavelength bands of 430 to 500 nm and 500 to 730 nm, by the light emitting device or the first phosphor.

7. The light emitting device package according to claim 4, wherein the light emitting device emits blue light or near-ultraviolet light.

8. The light emitting device package according to claim 4, wherein a light transmitting resin is disposed on the light emitting device and the first phosphor is present in the light transmitting resin.

* * * * *